(12) United States Patent
Schaper et al.

(10) Patent No.: US 6,359,264 B1
(45) Date of Patent: Mar. 19, 2002

(54) THERMAL CYCLING MODULE

(75) Inventors: Charles Schaper, Union City; Douglas W. Young, Sunnyvale; Hooman Bolandi, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/041,471

(22) Filed: Mar. 11, 1998

(51) Int. Cl.⁷ .............................. H05B 3/68; C23C 16/00
(52) U.S. Cl. ..................................... 219/444.1; 118/724
(58) Field of Search ........................... 219/444.1, 536, 219/540, 542, 543, 544; 118/723 UG, 724, 725, 621; 165/80.2, 80.4

(56) References Cited

U.S. PATENT DOCUMENTS

| | | | |
|---|---|---|---|
| 5,151,871 A | * 9/1992 | Matsumura et al. | 219/444.1 |
| H1145 H | * 3/1993 | Anderson | 118/724 |
| 5,294,778 A | * 3/1994 | Carmen et al. | 219/444.1 |
| 5,376,213 A | 12/1994 | Ueda et al. | 156/345 |
| 5,431,700 A | 7/1995 | Sloan | 29/25.01 |
| 5,460,684 A | * 10/1995 | Saeki et al. | 156/345 |
| 5,521,790 A | * 5/1996 | Ruckel et al. | 361/234 |
| 5,588,827 A | 12/1996 | Muka | 432/5 |
| 5,735,339 A | * 4/1998 | Davenport et al. | 165/80.2 |
| 5,766,824 A | 6/1998 | Batchelder et al. | 430/330 |
| 5,835,334 A | * 11/1998 | McMillin et al. | 361/234 |
| 5,846,375 A | * 12/1998 | Gilchrist et al. | 156/345 |

FOREIGN PATENT DOCUMENTS

WO    WO 98/05060    2/1998

* cited by examiner

*Primary Examiner*—Sang Paik
(74) *Attorney, Agent, or Firm*—Robert J. Stern

(57) ABSTRACT

A thermal cycling module for thermally processing a substrate has a thermally-conductive support structure with a planar first side and a second side with a plurality of recesses. A heater is disposed on the first side of the support structure and a fluid distributor positioned beneath the second side of the support structure to direct a coolant onto the support structure to decrease the temperature of the substrate. The fluid distributor may have a plurality of rotatable arms and a plurality of nozzles attached to each arm.

33 Claims, 7 Drawing Sheets

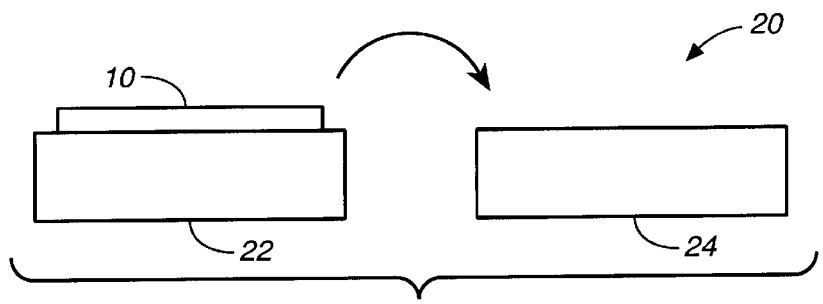
FIG._1
(PRIOR ART)
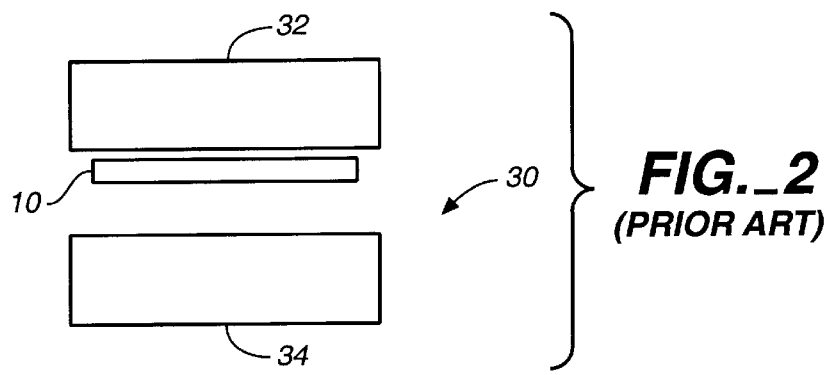
FIG._2
(PRIOR ART)
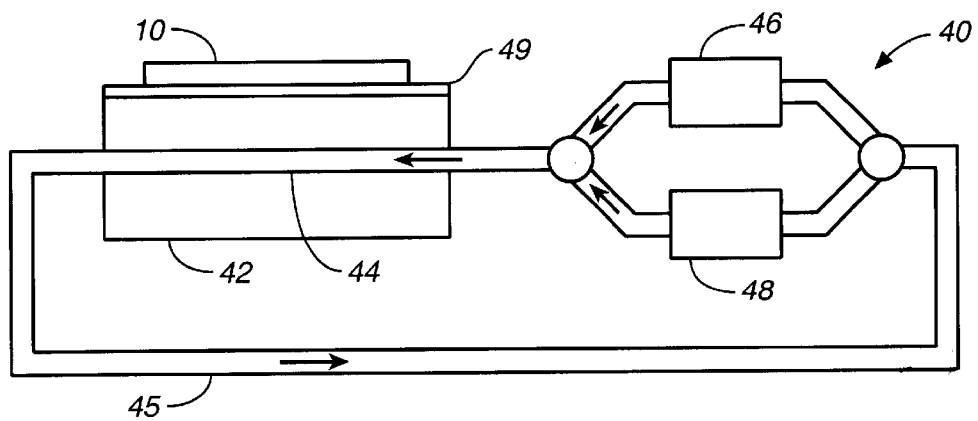
FIG._3
(PRIOR ART)

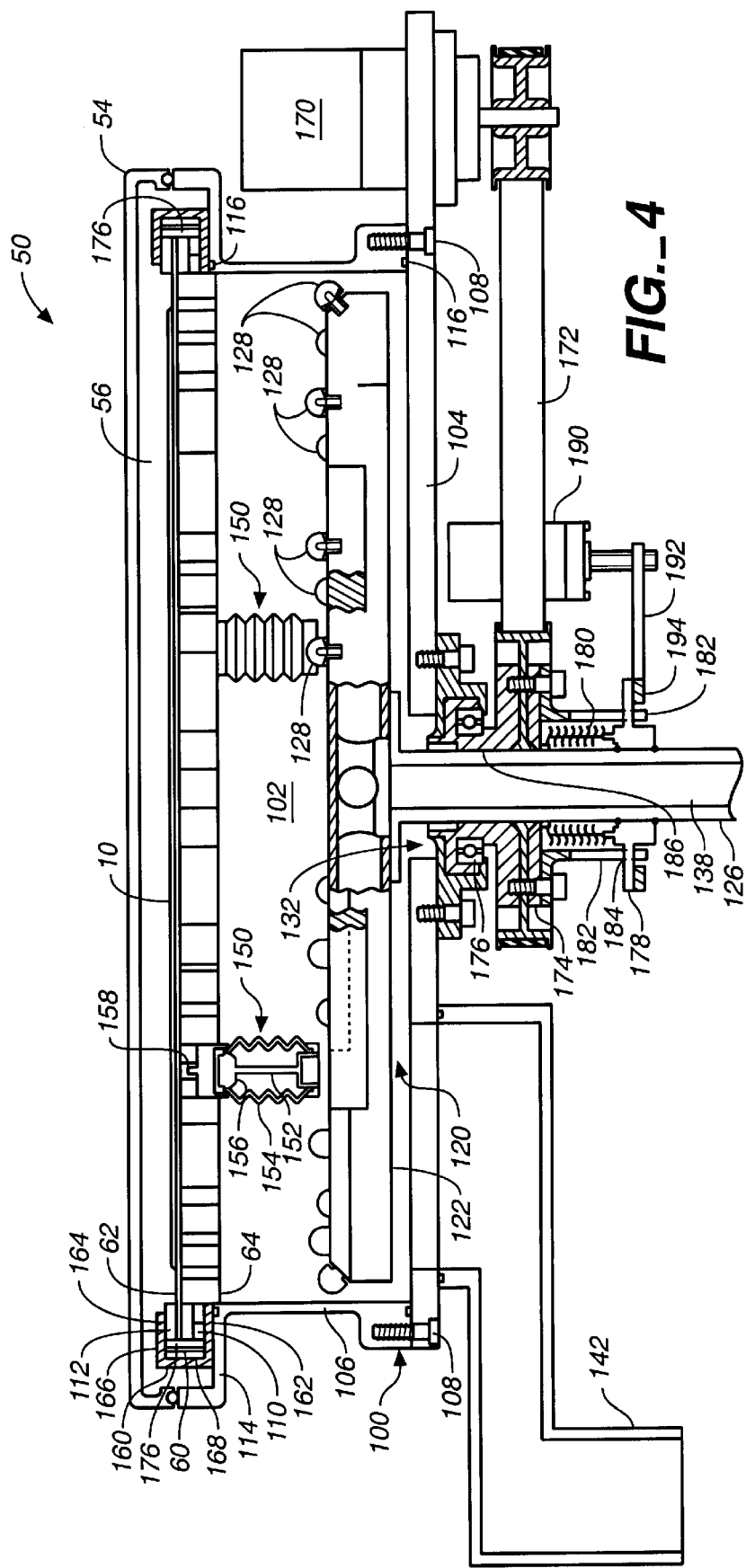
FIG._4

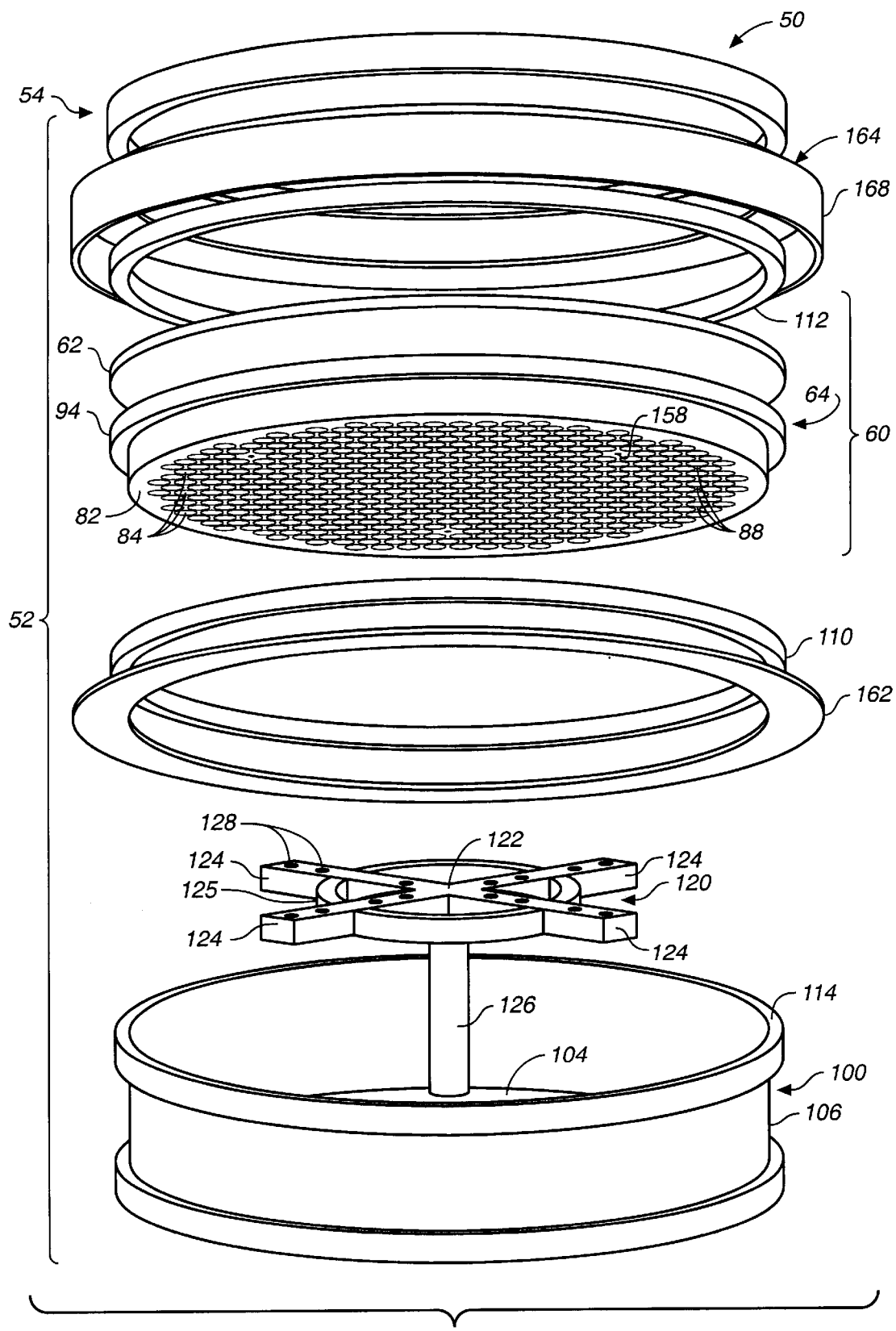
FIG._5

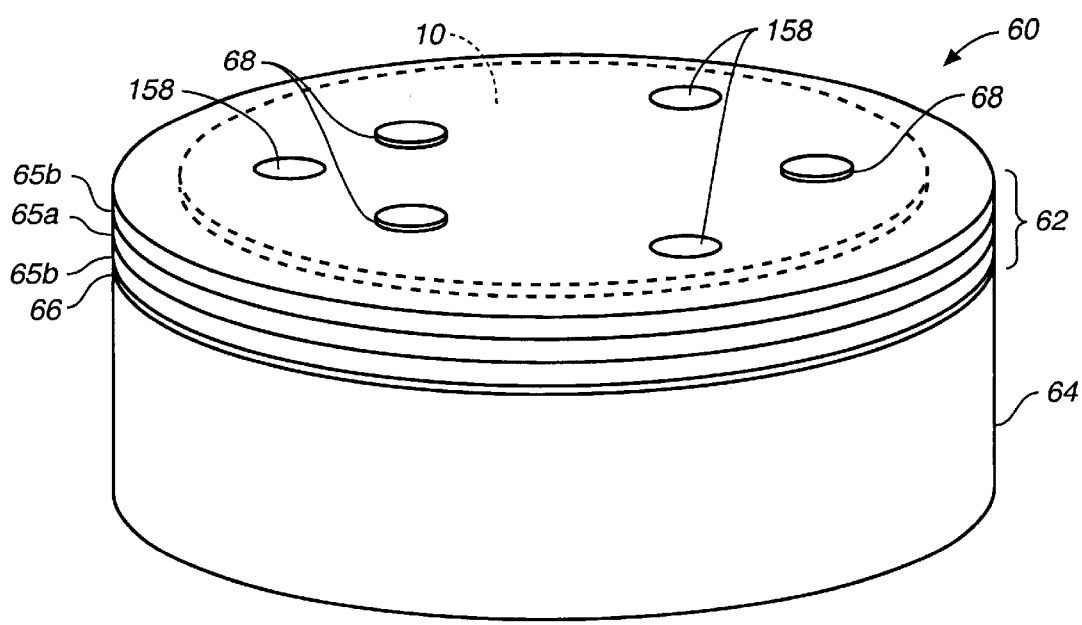
FIG._6
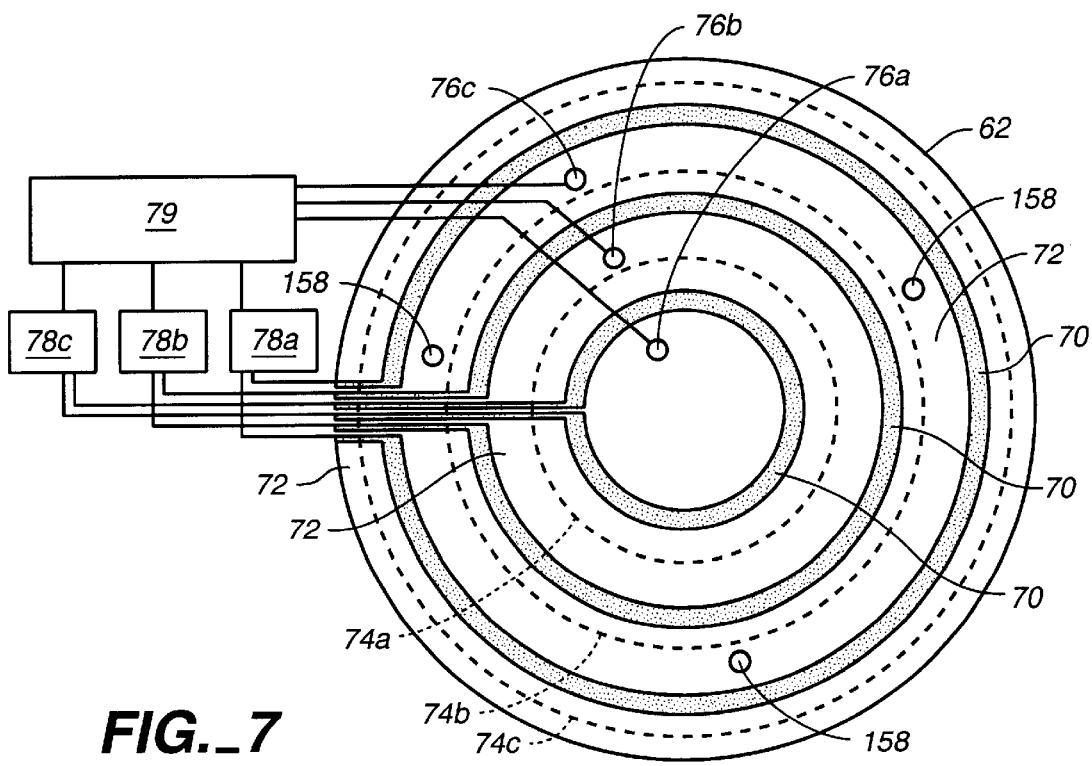
FIG._7

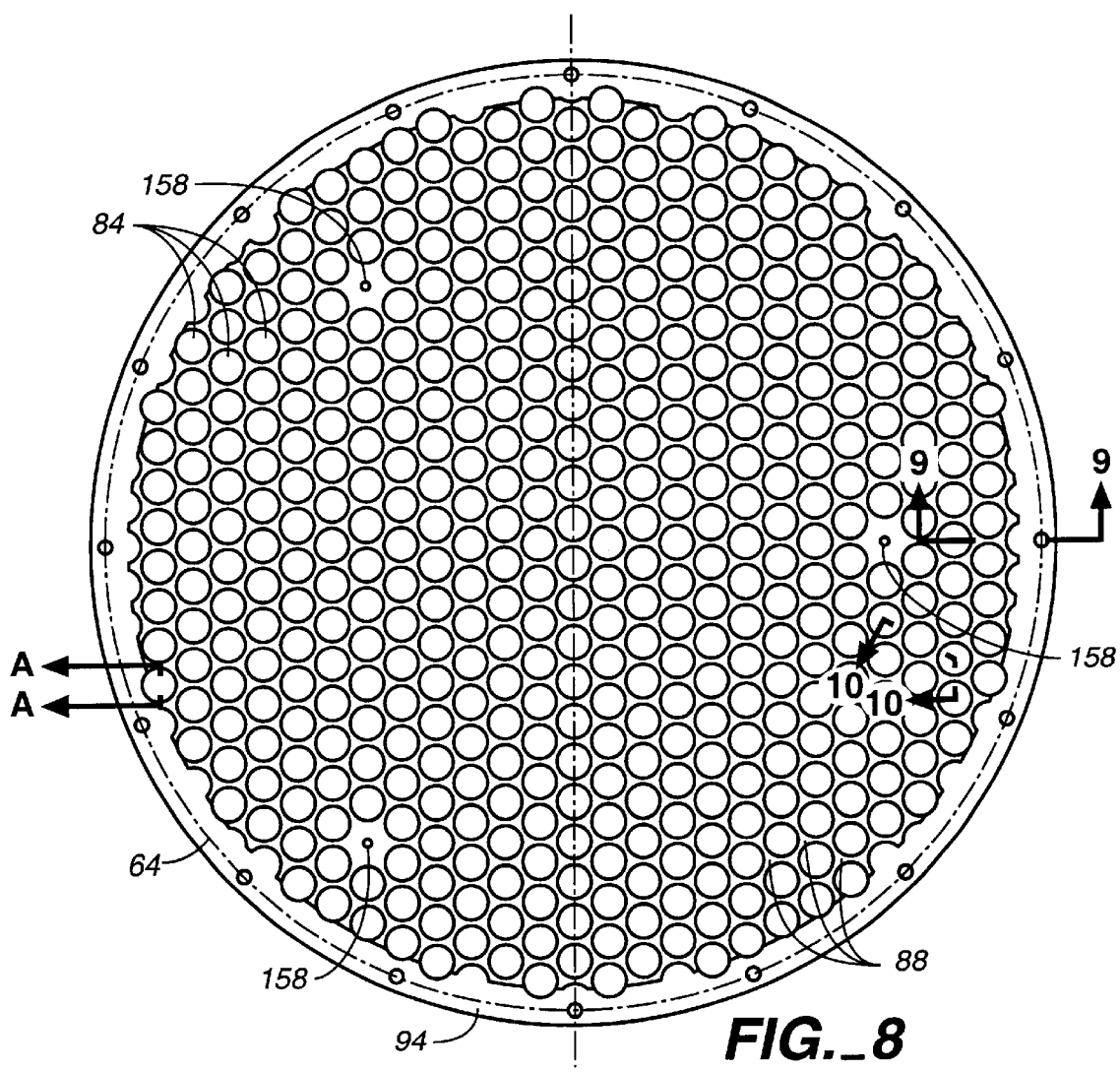
FIG._8
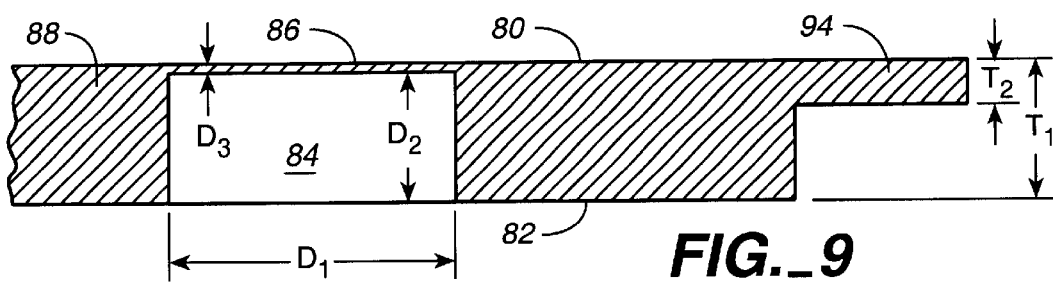
FIG._9

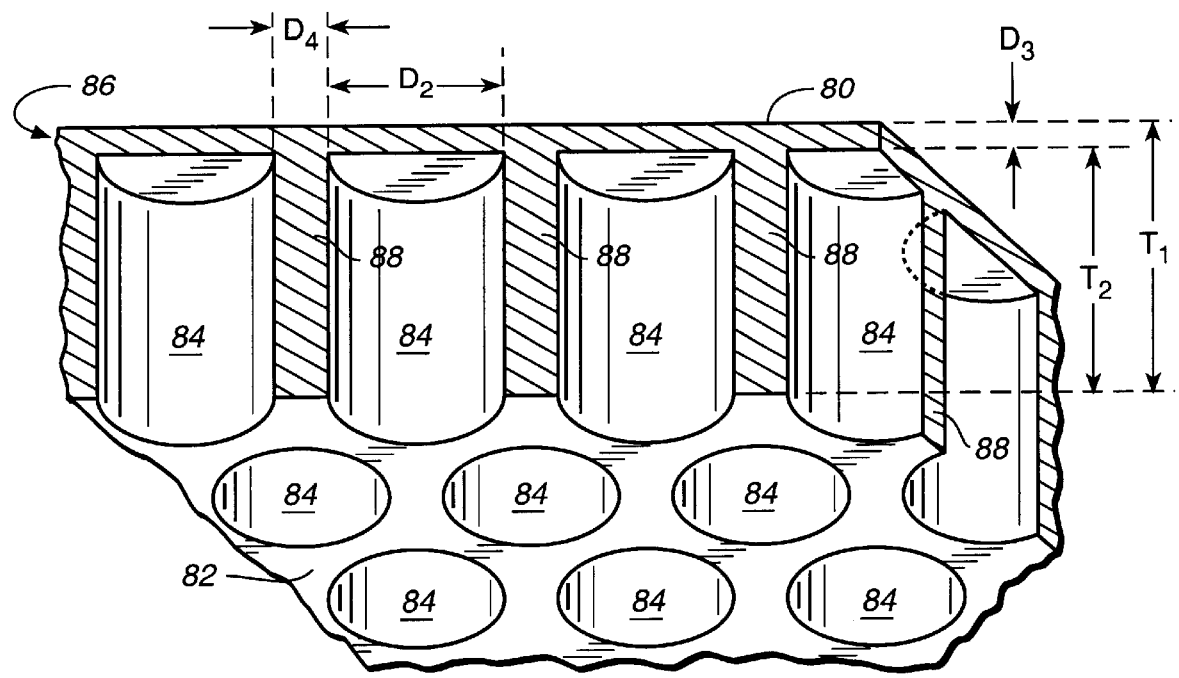
FIG._10
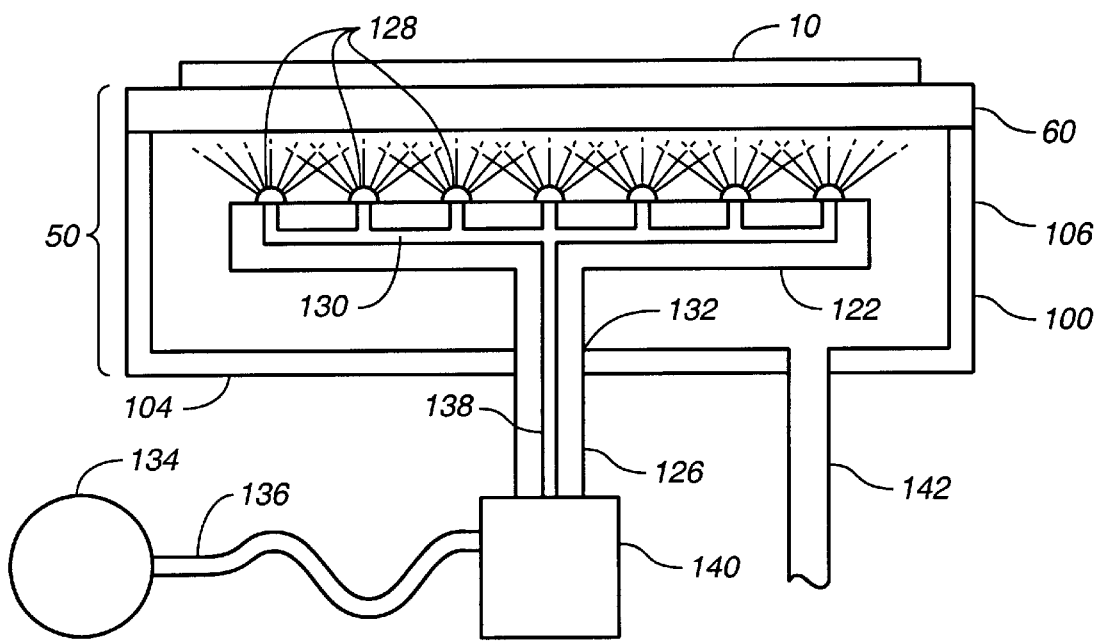
FIG._11

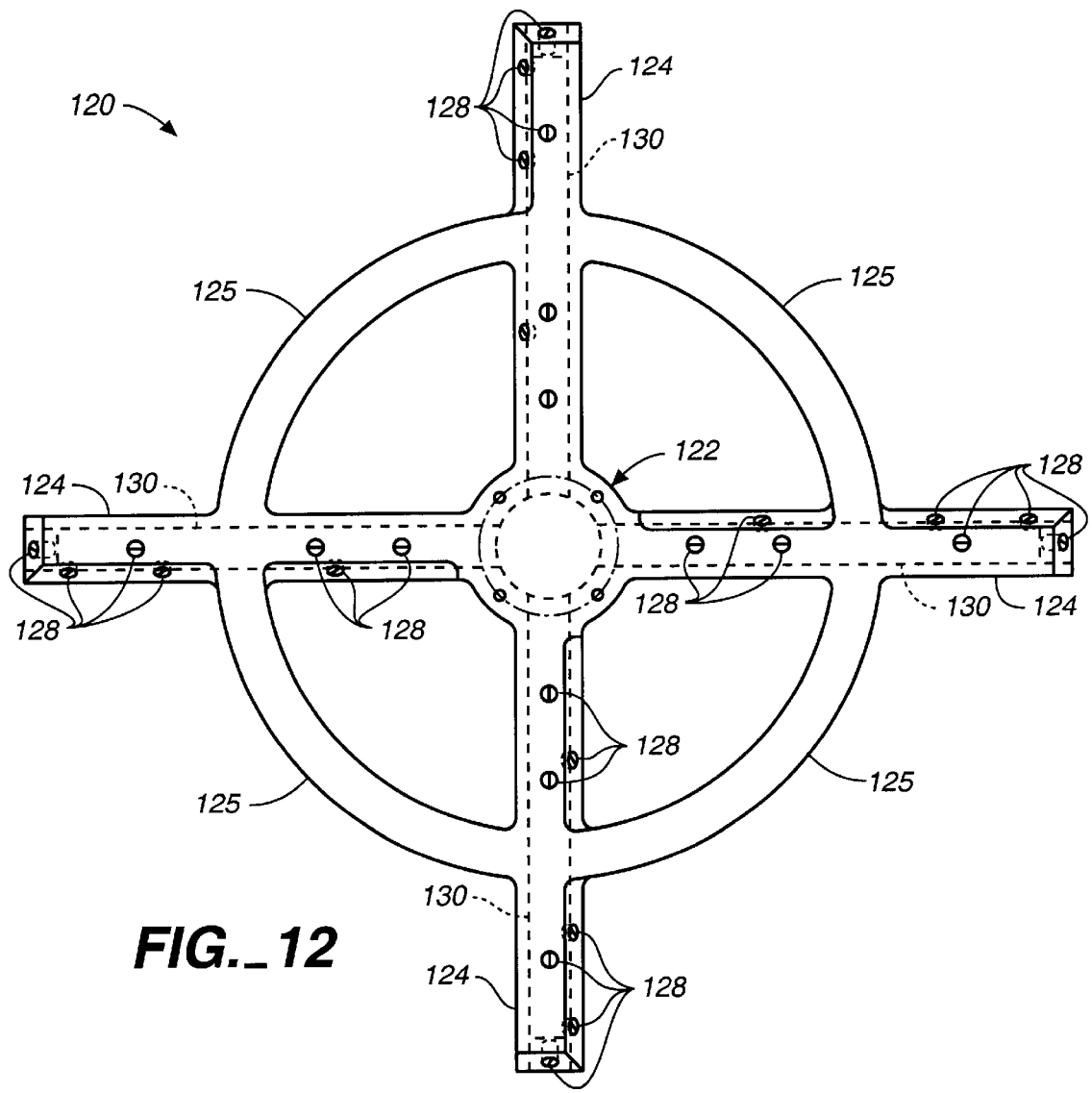
FIG._12
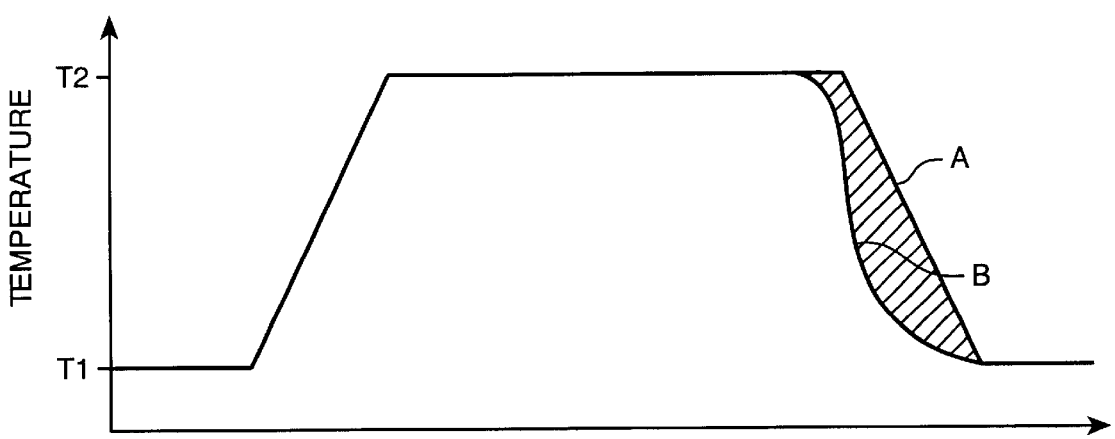
FIG._13

THERMAL CYCLING MODULE

BACKGROUND

The present invention relates generally to photoresist processing systems, and more particularly to a thermal cycling module for subjecting a substrate to a controlled temperature cycle.

To photolithographically fabricate an integrated circuit, a substrate, such as a semiconductor wafer, is coated with a layer of photoresist. The photoresist layer is exposed and then chemically developed to define circuitry features. As part of a photoresist processing step, the substrate may be subjected to a controlled thermal cycle to set or harden the photoresist layer. Typically, the substrate is heated to an elevated temperature, e.g., 70° to 250° C., maintained at the elevated temperature for a preselected duration, e.g., 30 to 120 seconds, and then cooled to a reduced temperature, e.g., 0° to 30° C. The temperature of the substrate must be precisely controlled during this thermal cycle to achieve a high yield.

Referring to FIG. 1, in a conventional photoresist processing system 20, a substrate 10 is initially placed on a hot plate 22 where it is heated. The substrate is then mechanically transported to a cold plate 24 where it is cooled. There are several disadvantages with this method of thermal cycling. First, the movement of the substrate through the environment from hot plate 22 to cold plate 24 subjects the substrate to uncontrolled and non-uniform temperature fluctuations. Second, temperature non-uniformities may arise from convection currents produced inside the plates during heating and cooling. Third, the time required to transport the substrate between the plates reduces the throughput of the system. Fourth, the substrate may be contaminated by the mechanical transport.

Referring to FIG. 2, in a prior art photoresist processing system 30, described in U.S. Pat. No. 5,431,700 and incorporated herein by reference, one of the plates, e.g., hot plate 32 is placed upside down and directly above the other plate, e.g., cold plate 34. The substrate 10 is suspended, e.g., with a lift pin assembly, between the two plates. Because substrate 10 only moves a short distance between hot plate 32 and cold plate 34, system throughput is improved and non-uniform temperature fluctuations experienced by the substrate are reduced. Nevertheless, because the substrate is moved between the plates, it can still experience uncontrolled and non-uniform temperature fluctuations and is subject to possible contamination.

Referring to FIG. 3, another prior art photoresist processing system 40, described by PCT Patent Publication WO9805060 and incorporated herein by reference, includes a single bake/chill plate 42. A passage 44 is formed through the body of plate 42. To raise the temperature of substrate 10, a hot fluid (e.g., between 150° and 250° C.) from a hot fluid supply 46 is cycled through passage 44 via a pipe or conduit 45. Similarly, in order to lower the temperature of the substrate, cold fluid from a cold fluid supply 48 is cycled through passage 44. The photoresist processing system 40 may also include an array of thermoelectric devices 49, such as resistive heating elements, positioned between the bake/chill plate and the substrate. Each thermoelectric device may be individually controlled by an associated temperature sensor and feedback circuit to ensure a uniform temperature across the substrate surface.

Although the substrate need not be mechanically transported between different plates in photoresist processing system 40, there are significant disadvantages associated with this system. First, the temperature of the entire plate 42 must be adjusted to control the temperature of the substrate. Since bake/chill plate 42 is a large thermal mass, its temperature can not be changed quickly, thereby reducing the throughput of the system. Second, due to the large thermal mass of bake/chill plate 42, operation of the photoresist processing system consumes a large amount of power. Third, the fluid supplies 46 and 48 are bulky and expensive. Fourth, the hot fluid flowing through pipe 45 posses a safety threat to personnel working near the system.

SUMMARY

In one aspect, the invention is directed to a thermal cycling module for thermally processing a substrate. The thermal cycling module includes a thermally-conductive support structure having a first side in thermal contact with the substrate during processing, a heater to increase the temperature of the substrate when the substrate is in thermal contact with the first side of the support structure, and a fluid distributor to direct a coolant onto a second side of the support structure to decrease the temperature of the substrate.

Implementations of the invention may include the following. The first side of the support structure may be substantially planar, and the second side of the support structure may include a plurality of recesses extending toward, e.g., almost entirely through the support structure, the first side. The distance between the bottom of the recesses and the first side may be about 20 mils. The fluid distributor may directs at least a portion of the coolant into the plurality of recesses. The recesses may be generally cylindrical in shape and may be disposed in a generally hexagonal array, and the support structure may include a plurality of support struts located between adjacent recesses. The heater may be a resistive heater deposited and bonded on the first side of the support structure. The heater may include a plurality of heating zones, and the thermal cycling module may further comprise a controller to independently control the temperature of each heating zone. The fluid distributor may include a plurality of nozzles to direct a spray of coolant, e.g., water, onto the second side of the support structure, e.g., with a substantially uniform flow. The fluid distributor may include a rotatable arm, and the nozzles may be attached to the arm and fluidly connected via a passage in the arm to a coolant supply. The arm may be rotated by the flow of fluid through angled nozzles, or by a motor. A housing may be secured to the support structure to form a fluid-tight chamber, and the fluid distributor may be is located in the chamber. The fluid distributor may include a ring-shaped member positioned below a plurality of lift pin assemblies, and an actuator may vertically move the fluid distributor such that the ring shaped member can contact the lift pins to cause movement thereof.

In another aspect, the thermal cycling module includes a support structure having a first surface adjacent to which the substrate may be positioned during processing, a heater to increase the temperature of the first surface to increase the temperature of the substrate, and a fluid distributor to direct a coolant onto a second surface of the support structure to lower the temperature of the first surface to thereby lower the temperature of a substrate positioned adjacent thereto.

In another aspect, the thermal cycling module includes a bake-chill plate and a fluid distributor. The bake-chill plate includes a resistive heater to raise the temperature of the substrate during processing and a plurality of recesses in a first surface thereof, and the fluid distributor directs a coolant spray at the first surface and into the recesses of the support structure to lower the temperature of the substrate.

In another aspect, the thermal cycling module has a bake-chill plate including a resistive heater to raise the temperature of the substrate and a honeycomb support structure to support the heater, and a fluid distributor to direct a coolant spray at an underside of the support structure to lower the temperature of the substrate.

In another aspect, the invention is directed to a method of thermally processing a substrate. In the method, a substrate is supported on a first side of a support structure, the temperature of the substrate is raised to an elevated temperature, the substrate is maintained at the elevated temperature for a predetermined period of time, and a coolant is directed onto second side of the support structure to lower the temperature of the substrate.

Advantages of the invention may include the following. The thermal cycling module can precisely control the temperature of a substrate, and can heat and cool the substrate using less power. The substrate remains positioned on a single bake/chill plate, thereby reducing the danger of contamination and non-uniform temperature fluctuations. Furthermore, the system is safer because the temperature cycling module does not require a hot fluid.

Other advantages and features of the invention will become apparent from the following description, including the drawings and claims.

BRIEF DESCRIPTION OF THE DRAWINGS

FIGS. 1–3 illustrate prior art photoresist processing systems.

FIG. 4 is a schematic cross-sectional view of a photoresist processing system according to the present invention.

FIG. 5 is a schematic exploded perspective view of the photoresist processing system of FIG. 4 (some elements of FIG. 4 are not shown for simplicity).

FIG. 6 is a schematic perspective view of a bake/chill plate of the photoresist processing system of FIG. 4.

FIG. 7 is partially a schematic plan top view of a thermoelectric heater of the bake/chill plate, and partially a schematic circuit diagram of the power supplies which control the thermoelectric heater.

FIG. 8 is a schematic plan bottom view of a support structure of the bake/chill plate.

FIG. 9 is a cross-sectional view taken along line 9—9 of FIG. 8.

FIG. 10 is a partially perspective and partially cross-sectional view taken along line 10—10 of FIG. 8.

FIG. 11 is a schematic diagram of the coolant control system for the photoresist processing system.

FIG. 12 is a schematic plan top view of a fluid distributor of the thermal cycling module.

FIG. 13 is a graph showing the relationship between temperature and time in a thermal cycle executed by the photoresist processing system of FIG. 4.

DETAILED DESCRIPTION

Referring to FIGS. 4 and 5, a photoresist processing system 50 includes a thermal cycling module 52 which is covered by a lid 54 to provide a thermal processing chamber 56. A substrate 10, such as a 200 mm or 300 mm diameter disk-shaped silicon wafer coated with a photoresist layer, is inserted into processing chamber 56 and placed in thermal contact with a bake/chill plate 60 of thermal cycling module 52. Substrate 10 is rapidly and uniformly heated (e.g., at about 5° C./second) by thermal cycling module 52 to an elevated temperature (e.g., about 70° to 250° C.), and maintained at that temperature for a preselected time (e.g., about 30 to 90 seconds) to cure the photoresist layer. Then the substrate is rapidly and evenly cooled (e.g., at about 5° C./second) at to a low temperature (e.g., about 0° C. to 30° C.).

The bake/chill plate 60 has a theremoelectric heater 62 to raise the temperature of the substrate, and a fluid distributor is provided 120 to spray a fluid coolant on the underside of bake/chill plate 60 to lower the temperature of the substrate. These elements will be described in greater detail below.

Referring to FIG. 6, substrate 10 (shown in phantom) is supported above bake/chill plate 60, which may be generally circular in shape to correspond to the configuration of the substrate. If substrate 10 is a twelve-inch diameter disk, bake/chill plate 60 may be about thirteen inches in diameter. The bake/chill plate 60 includes a support structure 64 that provides structural strength while permitting rapid cooling of the substrate, and the thermoelectric heater 62 may be disposed on the top surface of support structure.

As previously noted, substrate 10 is placed in thermal contact with bake/chill plate 60. Thermal contact may be established by direct physical contact sufficient to permit the transfer of heat by conduction. For example, substrate 10 may be placed against thermoelectric heater 62 and be held in place by vacuum chucking, electrostatic chucking, or gravity. Thermal contact may also be established by indirect physical contact sufficient to permit the transfer of heat through intervening heat-conducting elements. For example, one or more thermally conductive pads 68 may support the substrate above the thermoelectric heater. Each pad may be a strip of thin, thermally conductive tape formed of a polimide film about three to five mils thick, such as a Kapton™ sheet, available from I.E.DuPont of Wilmington, Del. Finally, thermal contact may be provided by placing the substrate in sufficiently close physical proximity to the bake/chill plate to permit the transfer of heat by convection or radiation, or some combination thereof. For example, substrate 10 may be supported above thermoelectric heater 62 by a plurality of lift pin assemblies 150 (see FIG. 4).

Thermoelectric heater 62 may be an extremely thin resistive heater, such as a foil heater. The foil heater may include a layer 65a of electrically-conductive material, e.g., stainless steel, tungsten or nickel-chromium, placed between two electrically-insulative layers 65b, e.g., two Kapton™ sheets. Both electrically conductive layer 65a and electrically insulative layers 65b are thermally conductive. The thermoelectric heater 62 may be bonded to support structure 64, e.g., with a Teflon® coating 66, or, alternately, deposited directly onto support structure 64, e.g., by chemical vapor deposition or by use of a plasma spray.

Referring to FIG. 7, the conductive layer is patterned or otherwise formed to provide electrically conductive paths 70 which are separated by electrically insulative spaces or regions 72 formed by contact between the insulative layers. The conductive paths 70 may be arranged to provide three individually controllable zones: a central zone 74a, a middle zone 74b surrounding the central zone, and an outer zone 74c surrounding the middle zone. Three temperature sensors 76a, 76b and 76c, e.g., thermocouples embedded in the insulative spaces, are positioned to sense the temperature of the substrate in zones 74a, 74b and 74c, respectively. The amount of current flowing through the conductive paths in zones 74a, 74b and 74c is controlled by power supplies 78a, 78b and 78c, respectively. Temperature sensors 76a–76c and power supplies 78a–78c may be connected to a controller 79, such as a programmed general-purpose digital computer. The controller uses the temperature measurements from sensors 76a–76c to control the current generated by power supplies 78a–78c to dynamically maintain substrate 10 (shown in phantom) at a desired temperature.

Although three zones 74a–74c are illustrated in FIG. 7, one, two, or four or more zones could be used. The number of zones in thermoelectric heater 62 depends upon the complexity of the thermal cycle, the size of the substrate to be processed, and the sensitivity of the photoresist material to temperature fluctuations. In addition, although the zones are illustrated as concentric annular regions to provide radially symmetric heating of the substrate, other shapes and geometrical arrangements of the conductive lines and heating zones are possible.

As shown in FIGS. 5 and 8–10, support structure 64 is a generally disk-shaped body having a moderate or high thermal conductivity. The support structure 64 includes a generally planar upper surface 80 on which thermoelectric heater 62 is located, and a plurality of indents or recesses 84 in its lower surface 82. A sufficient number of indents 84 may be provided so that most of the volume of support structure 64 is, in fact, open space. The array of indents in the support structure forms a honeycomb-like structure 96 having interconnected fins or struts 88 which provide both structural strength and a high surface area to volume ratio.

Most of the heat from thermoelectric heater 62 that is transmitted to support structure 64 will be retained in a thin laminar portion 86 (see FIG. 9) adjacent to upper surface 80. Thus, the portion of the support structure adjacent upper surface 80 acts as a laminar thermal mass to store and transmit heat from the thermoelectric heater. The laminar portion may have a thickness about equal to the distance between the bottom of the indents and the upper surface Support structure 64 may be fabricated by machining indents into a lower surface of a single block of thermally conductive material, such as aluminum or copper. Alternately, laminar portion 86 may be a thin laminar sheet may be fabricated and bonded to a separate honeycomb body.

In operation, thermoelectric heater 62 heats both laminar portion 86 of support structure 64 and substrate 10. Because the support structure is thermally conductive, heat will be transmitted across the entire surface of the bake/chill plate, thereby reducing temperature non-uniformities in the substrate. However, because the laminar portion is fairly thin, it has a low thermal mass and may be heated quickly with low power. Although some heat will flow from laminar portion 86 into fins 88, the amount of heat lost is not large due to the small contact surface area between the fins and the laminar portion. Consequently, little power is required by the thermal cycling module to heat the substrate to a desired temperature and to maintain it at that temperature.

In one implementation, support structure 64 has a thickness $T_1$ of about 0.75 inches. The support structure may also include a flange portion 94 (shown by a dashed line in FIG. 8) for connection to a housing 100, as described below, and for supporting lid 54. The flange portion lacks indents and has a thickness $T_2$ of about 0.25 inches, and may be formed by machining an outer rim portion of the lower surface of the support structure.

The indents 84 may form a tightly packed hexagonal array. Each indent 84 may be substantially cylindrical, with a diameter $D_1$ of about 0.54 inches and a depth $D_2$ of about 0.748 inches. Thus, laminar portion 86 has a thickness of $D_3$ of only about 20 mils. Adjacent indents 84 may be separated by a distance $D_4$ of about 0.020 inches, which defines the minimum thickness of fins 88.

Returning to FIGS. 4 and 5, two insulating rings 110 and 112 may be secured to the underside and upper surface, respectively, of flange portion 94 of support structure 64 by a clamp 160. The clamp 160 may include an annular lower clamp ring 162 that extends beneath lower insulating ring 110 and an annular upper clamp ring 164 that extends over upper insulating ring 112. The clamp rings 162 and 164 are secured, e.g., by a plurality of bolts 166, to clamp the insulating rings 110 and 112 to the bake/chill plate 60. The upper clamp ring 164 may also include a cylindrical downwardly-extending sleeve 168 that engages a ledge in the outer surface of lower clamp ring 162.

The bake/chill plate 60 and clamp 160 are secured to a bowl-shaped housing 100 to provide a chamber 102. Housing 100 may include a generally disk-shaped bottom plate 104 and a cylindrical sleeve 106 which is connected to the periphery of bottom plate 104, e.g., with bolts 108. Clamp 160 is secured, e.g., with bolts (not shown), to a rim portion 114 of sleeve 106. The insulating ring 110 reduces the flow of heat from support structure 64 to housing 100, and clamp 160 secures the edge of the bake/chill plate to reduce deformations caused by thermal expansion. O-rings 116 (not shown in FIG. 5 for clarity) may be used to provide fluid-tight seals between bottom plate 104 and cylindrical sleeve 106, and between cylindrical sleeve 106 and clamp 160.

Fluid distributor 120 is positioned in chamber 102 beneath bake/chill plate 60. To lower the substrate temperature, fluid distributor 120 directs a stream or spray of a fluid coolant, such as cold water, at a high velocity toward the underside of support structure 64. The coolant will draw heat from bake/chill plate 60, thereby lowering the substrate temperature. Specifically, the coolant from fluid distributor 120 is directed into indents 84 so that it directly contacts the bottom of the indents. In addition, the coolant contacts fins 88 to draw heat from the fins. Thus, the coolant rapidly and uniformly lowers the temperature of the support structure, the thermoelectric heater, and the substrate. The high surface area to volume ratio of the honeycomb structure promotes the efficient transfer of heat from the support structure to the coolant.

Referring to FIGS. 4, 5, 11, and 12, fluid distributor 120 may be configured to provide a radially symmetric flow of coolant to the underside of the support structure to ensure radially symmetric cooling of the substrate. Specifically, fluid distributor 120 may include a cross-shaped member or "helicopter" structure 122 having four arms 124 projecting from a hub 127 connected by an annular ring 125. The helicopter structure 122 is rotatably supported above bottom plate 104 by a rotatable and vertically actuatable drive shaft 126 that extends through an aperture 132 in the bottom plate. A plurality of nozzles 128, e.g., seven nozzles, are formed or attached to each arm 124. The nozzles 128 are connected to a coolant source 134 via a channel 130 (shown in phantom in FIG. 12) through each arm 124, a passage 138 in drive shaft 126, a rotary union 140, and a fluid supply line 136. A coolant, e.g., water at 0° to 30° C., is directed through nozzles 128 to generate a high pressure, high velocity spray onto the underside of bake/chill plate 60 to lower the substrate temperature. The pressure and flow rate of coolant through the fluid distributor may be selected to provide rapid cooling of the substrate (e.g., 5° C./second or more), given the thermal mass of the support structure and substrate. A drain pipe 142 may be connected to an aperture in bottom plate 104 to carry the spent coolant out of chamber 102 after it is deflected by the bake/chill plate.

At least some of the nozzles may be angled away from the axis of drive shaft 126 so that the coolant flow through the nozzles generates a torque which causes helicopter structure 122 to rotate. The rotation of helicopter structure 122 provides a radially symmetric distribution of coolant to the underside of bake/chill plate 60.

Helicopter structure 122 may also be driven by a rotary motor 170, either in addition to or instead of being self-propelled. Motor 170 may be coupled by a drive belt 172 to a pulley 174 that is rotatably suspended from bottom plate 104, e.g., by means of a bearing 176. The drive shaft 126 extends through an aperture 186 in the center of pulley 174. A drive ring 178 is secured to drive shaft 126 and is connected to pulley 174 by a vertically extendable bellows 180. Two or more drive pins 182 extend downwardly from pulley 174 and through receiving apertures 184 in drive ring 178 to transfer torque from the pulley to the drive ring while permitting relative vertical motion therebetween. In operation, motor 170 rotates pulley 174, which, in turn, rotates drive ring 178, drive shaft 126, and helicopter structure 122.

Since the outer portion of each arm sweeps over a larger surface area of the bake/chill plate than each arm's inner portion, nozzles 128 may be more closely spaced in the outer portions of the arms to ensure a uniform flow of coolant to the underside of bake/chill plate 60. However, nozzles 128 should not be located in ring portion 125 in order to avoid interference with actuation of the lift pin assemblies. Nozzles 128 may also be disposed to direct more coolant at the regions of bake/chill plate 60 which are normally at a higher temperature. These regions may be determined experimentally. In addition, the nozzles may direct coolant onto cylindrical sleeve 106.

The lift pin assemblies 150 (not shown in FIG. 5 for clarity) each include a lift pin 152, a flexible bellows 154 and a seal 156. There may be three lift pin assemblies attached to the underside of bake/chill plate 60. Each lift pin 152 may extend through an aperture 158 in bake/chill plate 60 to lift or lower the substrate. The lift pin assemblies are located above ring 125 of helicopter structure 122. A vertically movable arm 192 extends from a pneumatic actuator 190, which may be secured to the underside of bottom plate 104, to rotatably support drive ring 178 by means of a bearing 194. Thus, pneumatic actuator 190 controls the vertical position of drive shaft 126 and helicopter structure 122. To actuate the lift pin assemblies, the rotation of helicopter structure 122 is stopped. Then pneumatic actuator 190 raises shaft 126 and helicopter structure 122 so that ring portion 125 contacts the bottom surface of each lift pin assembly 150 to raise and lower lift pins 152.

Referring to FIG. 13, to operate photoresist processing system 50, bake/chill plate 60 is initially at a low temperature $T_1$, e.g., 20° C. A substrate 10, e.g., also at a temperature of about 20° C., is inserted into processing chamber 56 and lowered into position by lift pin assemblies 150. The thermoelectric heater is activated to rapidly heat the substrate to an elevated temperature $T_2$ of between about 75° and 250° C. Thereafter, the power supplied to the thermoelectric heater is reduced to a level sufficient to maintain the substrate at the elevated temperature $T_2$. At the end of the thermal cycle, the power supplied to the thermoelectric heater is deactivated and coolant is sprayed on the underside of bake/chill plate 60 to lower the substrate temperature back to temperature $T_1$. Alternately, a small amount of power may be supplied to the thermoelectric heater to "trim" the temperature profile of the substrate. That is, thermoelectric heater 62 may provide sufficient heat so that substrate 10 undergoes a well defined temperature cycle, e.g., a substantially linear decrease (curve A) rather than a non-linear decrease (curve B) that might otherwise occur, so that each substrate undergoes the exactly same temperature cycle so as to improve process uniformity.

Alternate structures of thermal cycling module 52 and bake/chill plate 60 are possible. For example, indents 84 may be hexagonal rather than circular in shape. The indents may be disposed in a rectangular array so that fins 88 provide a rectangular lattice rather than a hexagonal honeycomb. A plurality of grooves or slots may be formed in upper surface 80 of support structure 64 to reduce the deformation of the support structure by allowing for horizontal thermal expansion. The nozzles of fluid distributor 120 may be replaced by a linear aperture which extends along the length of each arm. Additionally, the fluid distributor could oscillate rather than rotate. The fluid distributor could also be fixed in position, and the nozzles arranged to spray the coolant across the entire underside of the bake/chill plate. For example, the nozzles could be attached directly to bottom plate 104 or sleeve 106 of the housing to form the fluid distribution system. The lift pins could be actuated by separate lift pin arms that extend to or along the sides of chamber 102 and through separate apertures in the housing.

Although the substrate has been described as a silicon wafer, the invention may be applicable to other sorts of thermally processed objects, such as flat panel displays, glass plates or disks, and plastic work pieces. In addition, although the thermal cycling module has been described as part of a photoresist processing system, the invention may be applicable to other integrated circuit fabrication processes, such as rapid thermal processing, chemical vapor deposition and physical vapor deposition, in which the substrate temperature must be precisely controlled.

The invention is not limited to the embodiment depicted and described. Rather the scope of the invention is defined by the appended claims.

What is claimed is:

1. A thermal cycling module for thermally processing a substrate, comprising:
    a thermally conductive support structure including
        a plate having a front surface adapted to thermally contact the substrate and having a rear surface opposite the front surface, the plate being characterized by a thickness between the front and rear surfaces,
        a matrix of interconnected, fin-shaped support struts attached to the rear surface of the plate, and
        a plurality of openings between the struts, wherein said openings expose almost all of the rear surface of the plate,
    wherein each strut has a length extending away from the rear surface of the plate, and wherein the plate and the struts are sufficiently thin relative to the length of the struts so that said openings occupy almost the entire volume of the support structure; and
    a fluid distributor having at least one nozzle that sprays a coolant fluid through the openings in the support structure and onto said rear surface of the plate.

2. The thermal cycling module of claim 1, wherein the front surface of the plate is substantially planar.

3. The thermal cycling module of claim 1, wherein the thickness of the plate is about 20 mils.

4. The thermal cycling module of claim 1, wherein the struts are arranged in a hexagonal array.

5. The thermal cycling module of claim 1, wherein the openings are cylindrical in shape.

6. The thermal cycling module of claim 1, further comprising:
a heater mounted in thermal contact with the front surface of the plate.

7. The thermal cycling module of claim 6, wherein the heater is an electrical resistance heater mounted on the front surface of the plate.

8. A thermal cycling module according to claim 1, wherein the length of the struts is at least 37 times greater than the thickness of the plate.

9. A thermal cycling module, comprising:
a thermally conductive support structure having a first side adapted to be positioned adjacent to and in thermal communication with a substrate; and
a rotatable fluid distributor that includes at least one nozzle that sprays a coolant fluid onto a second side of the support structure.

10. The thermal cycling module of claim 9, wherein the fluid distributor includes a plurality of nozzles attached to a rotatable arm, and wherein the plurality of nozzles are fluidly connected via a passage in the arm to a coolant supply.

11. The thermal cycling module of claim 10, further comprising a motor to rotate the arm.

12. The thermal cycling module of claim 10, wherein the nozzles are angled so that flow of the coolant fluid through the nozzles causes the arm to rotate.

13. The thermal cycling module of claim 12, further comprising a housing secured to the support structure to form a fluid-tight chamber, wherein the fluid distributor is located in the chamber.

14. The thermal cycling module of claim 1, wherein the coolant fluid is liquid water.

15. A thermal cycling module according to claim 9, further comprising:
a heater disposed on the first side of the support structure.

16. A thermal cycling module for thermally processing a substrate, comprising:
a bake-chill plate including a resistive heater and a honeycomb support structure to support the bake-chill plate; and
a fluid distributor to spray a coolant liquid at an underside of the support structure.

17. A method of thermally processing a substrate, comprising the steps of:
providing a thermally conductive support structure including
a plate having a front surface adapted to thermally contact the substrate and having a rear surface opposite the front surface, the plate being characterized by a thickness between the front and rear surfaces;
a matrix of interconnected, fin-shaped support struts attached to the rear surface of the plate, wherein openings between the struts expose almost all of the rear surface of the plate, wherein each strut has a length extending away from the rear surface of the plate;
supporting the substrate adjacent the front surface of the plate; and
directing a coolant liquid through said openings in the support structure and onto the rear surface of the plate;
wherein the plate and the struts are sufficiently thin relative to the length of the struts so that said openings occupy almost the entire volume of the support structure.

18. The method of claim 17, further comprising the step of:
heating the substrate to an elevated temperature.

19. The method of claim 18, wherein the step of heating the substrate includes conducting electricity through a resistive heater located on the support structure.

20. The method of claim 17, wherein the step of directing the coolant includes spraying the coolant through a plurality of nozzles.

21. The method of claim 18, wherein the step of directing the coolant is performed subsequent to the heating step.

22. A method of thermally processing a substrate, comprising the steps of:
supporting a substrate adjacent a first surface of a support structure;
rotating a fluid distributor; and
spraying a coolant liquid from the rotating fluid distributor onto a second surface of the support structure.

23. Apparatus for controlling the temperature of a substrate, comprising:
a substrate support structure including
a plate having a substantially planar front surface adapted to thermally contact the substrate and having an opposing rear surface, the plate being characterized by a thickness in an axial direction between the front and rear surfaces, and
a plurality of thermally conductive fins abutting the rear surface of the plate, wherein each fin has a length extending away from the rear surface, such length being substantially greater than said thickness of the plate; and
a fluid distributor having at least one nozzle for spraying a coolant fluid onto the fins.

24. Apparatus according to claim 23, wherein said plurality of fins collectively forms a honeycomb structure.

25. Apparatus according to claim 23, wherein said plurality of fins are contiguous and are attached together at areas of contiguousness.

26. Apparatus according to claim 23, wherein the plate and the fins are sufficiently thin relative to the length of the fins so that openings between the fins occupy almost the entire volume of the support structure.

27. Apparatus according to claim 23, wherein the length of the fins is at least 37 times greater than the thickness of the plate.

28. Apparatus according to claim 23, further comprising:
an electrical resistance heater mounted in thermal contact with the front surface of the plate.

29. A method of controlling the temperature of a substrate, comprising the steps of:
providing a chamber having an interior that includes an open region;
providing a substrate support structure having a plurality of thermally conductive, contiguous fins and a substrate support plate having a front surface, a rear surface, and a thickness dimension between the front and rear surfaces;
positioning the support structure within the chamber so that the rear surface is exposed to the open region of the chamber;
supporting the substrate adjacent the front surface of the support structure; and
spraying a coolant liquid across the open region of the chamber and onto the fins;
wherein each fin has a length extending away from the rear surface, such length being substantially greater than said thickness of the plate.

30. A method according to claim 29, wherein said plurality of fins collectively forms a honeycomb structure.

31. A method according to claim 29, wherein said plurality of fins are contiguous and are attached together at areas of contiguousness.

32. A method according to claim 29, wherein the plate and the fins are sufficiently thin relative to the length of the fins so that openings between the fins occupy almost the entire volume of the support structure.

33. A method according to claim 29, wherein the length of the fins is at least 37 times greater than the thickness of the plate.

* * * * *